United States Patent [19]

Shirota

[11] Patent Number: 4,724,319
[45] Date of Patent: Feb. 9, 1988

[54] IMAGE FOCUSING METHOD AND APPARATUS FOR ELECTRON MICROSCOPE

[75] Inventor: Kohei Shirota, Akikawa, Japan

[73] Assignee: Akashi Seisakusho Ltd., Tokyo, Japan

[21] Appl. No.: 848,021

[22] Filed: Apr. 3, 1986

Related U.S. Application Data

[63] Continuation of Ser. No. 744,883, Jun. 14, 1985, which is a continuation of Ser. No. 396,808, Jul. 9, 1982.

[30] Foreign Application Priority Data

Jul. 17, 1981 [JP] Japan .................................. 56-110888

[51] Int. Cl.⁴ ........................ G01N 23/04; H01J 37/26
[52] U.S. Cl. .................................... 250/307; 250/311; 250/396 ML
[58] Field of Search .................... 250/311, 307, 396 R, 250/396 ML

[56] References Cited

U.S. PATENT DOCUMENTS

| | | | |
|---|---|---|---|
| 3,504,176 | 3/1970 | Thon | 250/311 X |
| 3,715,582 | 2/1973 | Akahori et al. | 250/396 R |
| 3,719,776 | 3/1973 | Fujiyasu et al. | 250/311 X |
| 3,737,617 | 6/1973 | Llop et al. | 250/311 |

Primary Examiner—Craig E. Church
Assistant Examiner—Jack I. Berman
Attorney, Agent, or Firm—Warren B. Kice

[57] ABSTRACT

A method and apparatus for automatically focussing a specimen image in an electron microscope. Excitation currents for an objective lens of the microscope are previously determined in accordance with predetermined magnifications in one-to-one correspondence. When one of the magnifications is selected, the objective lens is automatically excited with the current corresponding to the magnification, whereby the specimen image is automatically properly focussed.

8 Claims, 5 Drawing Figures

IMAGE FOCUSING METHOD AND APPARATUS FOR ELECTRON MICROSCOPE

This is a continuation of application Ser. No. 744,883, filed June 14, 1985, which, in turn, is a continuation application of application Ser. No. 396,808, filed July 9, 1982.

BACKGROUND OF THE INVENTION

1. Field of the Invention

The present invention generally relates to a focusing method for an electron microscope. In particular, the invention concerns a transmission electron microscope provided with afacility for photographic recording which allows observation and recording of a specimen image to be carried out in a much facilitated manner while assuring an improved image quality by virtue of an incorporated automated focusing system so arranged as to suppress focal deviations within a permissible range for a selected magnification, particularly in a range of moderate and low magnifications.

2. Description of the Prior Art

Photographic recording of a specimen image produced by a transmission electron microscope is rather a troublesome job requiring high skill. It is certainly troublesome to bring the image under observation to a properly focussed state as desired with the aid of the image produced on a viewing fluorescent screen which is usually poor in resolution. This can be explained by the fact that the magnification at which the image is produced on the screen is lowered by 10 to 30% when compared with the magnification at which the image is projected onto a photographic film and that resolution of the film is on the order of 10 to 40 μm while that of the fluorescent, screen is on the order of 50 to 100 μm. Under the circumstance, even the sharp and clear image viewed on the screen will often result in a blurred image when recorded photographically on the film.

By the way, a biological specimen is susceptible to injury by electron beam, whereby the intrinsic structure of the specimen may be destroyed to make it impossible to obtain desired information from the specimen, as is known in the art. For this reason, selection of the field of view is effected in the state where energy or density of the electron beam is considerably reduced. Of course, the photographing itself will certainly involve substantially no damages to the biological specimen, because of an extremely short time as required. However, since the specimen imaging may not be effected in a satisfactory manner unless fine structure of the specimen in concern can be observed, the specimen undergoes necessarily irradiation with the electron beam of a high density for a relatively long time in order to produce a bright and clear image on the fluorescent screen, which in turn means that the biological specimen is subjected to appreciable injuries.

In reality, the troublesome and time consuming procedure required for the focusing has provided a great obstacle in realizing the automated photographic recording of the microscopical image. More particularly, automation of the photographic recording system is at present accomplished so far as the exposure or light meter capable of detecting at high precision the energy level of the electron beam incident on the fluorescent screen, a shutter mechanism for assuring a proper exposure in dependence on the indication output from the light meter, an automatic film feed and a data printer for printing data like the magnification as employed, the frame number and the like are concerned. Besides, there has been already developed an automated view field selecting system in which a specimen stage adapted to be driven by an electric motor is combined with a central processing unit or computer so that portions of a specimen to be observed can be stored and read out. With this system, a number of view fields or points to be observed are previously stored in a memory equipment, wherein the fields of view are selectively read out one-by-one or successively for the observation and/or recording. In contrast, the imaging or focusing of the specimen image relies utterly on the manipulation by operator himself, taking a lot of time providing a difficulty in attaining the rapid recording as a whole in spite of the automation of the relevant mechanisms described above. Various attempts have heretofore been made for accomplishing the automatic focussing. For example, it is conceived that an image on the fluorescent screen is converted into electric signals which are then utilized in an electronic unit for automatically determining whether the focusing or specimen imaging is accomplished to a satisfactory degree. However, such system is not only complicated and expensive but also incapable of presenting reliable measures because of poor availability of the signals and other causes. Such being the circumstance, the automatic focusing system for taking picture of the microscopic image is at present far from practical application.

SUMMARY OF THE INVENTION

Accordingly, it is an object of the present invention to provide a photographic recording system for an electron microscope which is immune to the shortcomings of the hitherto known system.

Another object of the invention is to provide an electron microscope provided with facilities which allow the focusing of a specimen image to be automatically and rapidly accomplished in a reduced time to thereby facilitate and expedite the photographic recording procedure as a whole, while protecting the specimen from injuries or destruction due to long irradiation of the electron beam.

Still another object of the invention is to provide a method which is capable of photographically recording electron-microscopic images in a fully automated manner by combining the automatic focusing feature with the automated photographic recording conditioning means such as the automatic exposure setting means and assuring an improved reliability for the photographically recorded image in respect of the image quality.

A further object of the invention is to provide an apparatus for carrying out the above method.

In view of the above and other objects which will be more apparent as description proceeds, it is proposed according to a general aspect of the invention that excitation current for an objective lens are previously set at one or more values for every magnification of the electron microscope, which values can assure the desired forcusing for obtaining an image of specimen with an improved quality at a selected magnification, so that the focusing can be automatically effected for the selected magnification.

Above and other objects, features and advantages of the invention will be readily understood upon consideration of the following description of preferred embodiments of the invention. Description makes reference to the accompanying drawings.

DETAILED DESCRIPTION OF THE PREFERRED EMBODIMENTS

Now, the invention will be described in detail by referring to the accompanying drawings.

Figure 1A:
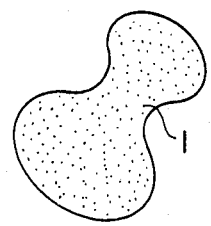
FIG. 1 shows schematically a specimen observed by an electron microscope and an image of the specimen to illustrate fringe effect.
Figure 1B:
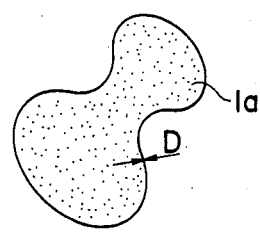

In general, in the examination of a specimen by means of an electron microscope, the specimen, inter alia the biological specimen is usually prepared in thickness in a range of 60 to 80 nm for the microscopical observation. In connection with the observation of such extremely thin specimen with a low or small magnification on the order of 50,000 or less, it is known that the specimen image of clearer contrast can be obtained when the observation is carried out in the state in which the focal point of the electron microscope is slightly displaced toward the under-focus region from the point corresponding to the just-focus. This can be explained by the fact that the structure of a specimen 1 shown in FIG. 1 at (A) makes appearances with a peripheral edge thereof being emphasized by a so-called under-fringe which corresponds to the Fresnel fringe observed on the side of the under-focus, whereby the outline of the specimen 1 is made more distinct to produce a specimen image 1a of high sharpness. When the width D of the fringe, i.e. the thickness of the contour line shown in FIG. 1 at B is too small, then the sharpness of the outline of the specimen is correspondingly reduced, while excessively large width of the fringe causes the contour of the specimen image 1a to be blurred. The value of the fringe width D at which the desired fringe effect can be recognized more or less on the photograph of the specimen image 1a lies in a range of 50 to 120 $\mu$m.

The focal undershoot (i.e. displacement to the under-focus region) $\Delta f$ relative to the just-focal point of the objective lens of the electron microscope is given by the following expression:

$$\Delta f = D^2/3.2\lambda M^2 \quad (1)$$

where D represents the fringe width, $\lambda$ represents the wavelength of electron beam determined by the accelerating voltage, and M represents the magnification.

Figure 2:
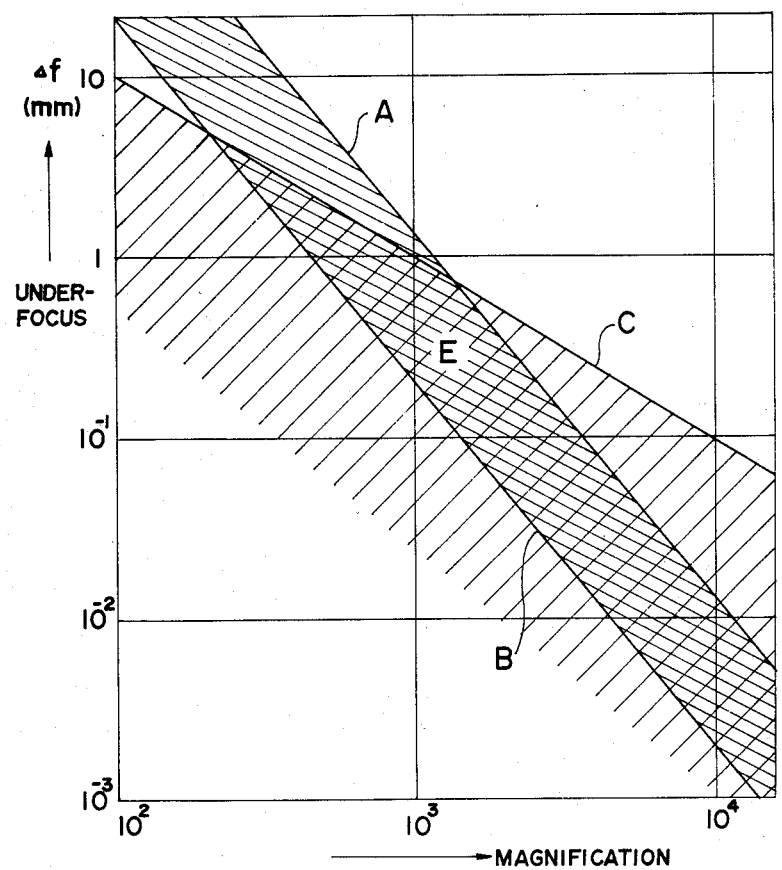
FIG. 2 graphically illustrates relationships among a range of underfocuses in which images of a high quality can be obtained, a range of under-focuses corresponding to a maximum permissible range of blur and magnifications of an electron microscope, which relationships provide a base for the invention.

When the accelerating voltage for the electron beam is set at 100 KV, the range of the focal undershoot $\Delta f$ which satisfies the condition that 50 $\mu$m $\leq$ D $\leq$ 120 $\mu$m on the photograph of the specimen corresponds to a region shown enclosed by lines A and B in FIG. 2.

Figure 3:
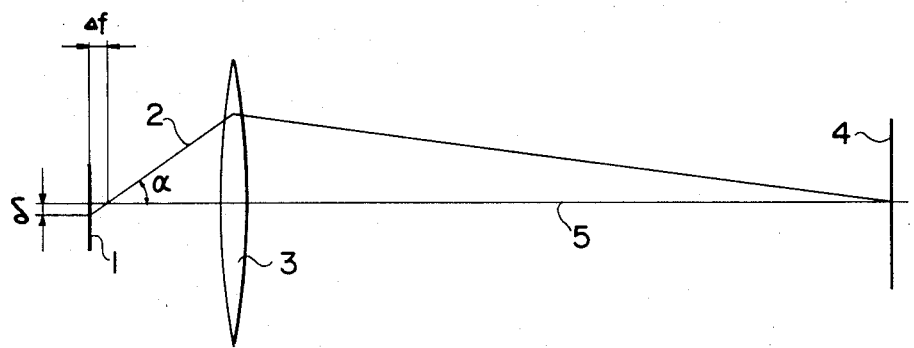
FIG. 3 shows schematically a lens system for illustrating the blur phenomenon of image as well as observation of the image in the underfocus state as taught by the invention.

Next, consideration is made of blur due to the divergence of the electron beam 2 incident on the objective lens 3 which is essentially determined by the scattering angle of the beam transmitted through the specimen 1. When angle of the divergence of the beam is represented by $\alpha$ (refer to FIG. 3), the blur $\delta$ determined by the angle $\alpha$ and the focal undershoot $\Delta f$ is given by the following expression:

$$\delta = M \cdot \Delta f \cdot \alpha \quad (2)$$

where M represents the magnification of the photographed specimen. The divergence angle $\alpha$ which is essentially determined by the scattering of the specimen 1 substantially independent of the divergence of the electron beam incident on the specimen is usually constant and on the order of $1 \times 10^{-4}$ rad. When a boundary value with respect to which the blur $\delta$ can be discriminated on the photograph is set at 100 $\mu$m, then the condition that $\delta \leq 100$ $\mu$m should be satisfied. The range in which the above condition is satisfied corresponds to the region of the focal undershoot $\Delta f$ which lies under the line C shown in FIG. 2. Thus, it can be said that the range in which the sharp and clear image of the specimen can be observed under the desired fringe effect while the blur being suppressed to a negligible degree corresponds to the area E enclosed by the lines A, B and C in FIG. 2. In other words, the specimen image of an improved quality can be obtained so far as the focusing is carried out on the conditions falling within the area E. This in turn means that the focusing which allows the sharp and clear specimen image to be observed and/or photographically recorded can be automatically realized, when the focal undershoot $\Delta f$ can be automatically correspondingly controlled. For controlling the focal undershoot or under-focus quantity $\Delta f$, it is assumed that the value of excitation current of an objective lens 3 at which the image of the just-focal point is imaged at an image plane 4 in the lens system shown in FIG. 3 is represented by $I_o$ amperes. Then, the relationship between variation $\Delta I$ in the excitation current and variation in the focusing, i.e. the focal undershoot $\Delta f$ may be expressed as follows:

$$\Delta f = 2 \cdot C_c \cdot \Delta I / I_o \quad (3)$$

where $C_c$ represents chromatic aberration coefficient of the objective lens 3. As will be readily seen from the above expression (3), the quantity $\Delta f$ can be controlled in an arbitrary manner by correspondingly varying the quantity $\Delta I$. In this connection, it will also be readily understood that the control of $\Delta I$ can be accomplished finely and accurately by resorting to an electrical control technique. It should here be mentioned that in the case of the hitherto known electron microscopy, the focusing is repeatedly effected every time the photograph of the screen image is taken because of de-focus which is ascribable to the causes mentioned below:

(a) Inaccuracy or deviation in positioning the specimen 1 along the optical axis 5 of the objective lens 3.

(b) Non-uniformity in regenerated hysteresises of the magnetic circuit for the objective lens 3.

(c) Correction of the focal point required in view of the fact that displacement of the objective plane of an intermediate lens and hence that of the image plane of the objective lens 3 are brought about upon changing of magnification. (Since the specimen is positioned on the objective plane which itself is fixed, de-focus will occur when the image plane is displaced along the optical axis, unless the focal length of the objective lens is varied or adjusted.)

The first mentioned inaccuracy or error in positioning the specimen is attributable to the placing or removal of the specimen on or from the stage and bending of the specimen itself and is generally on the order of 10 $\mu$m. This error can further be reduced by positioning the specimen carefully or by adopting the specimen positioning means designed so as to suppress the positioning error to minimum. The second mentioned problem, that is, non-uniformity of hysteresis is usually on the order of 0.1% and can be reduced to ca. 0.5 $\mu$m for the lens having a focal length of ca. 5 $\mu$m. Besides, the non-uniformity of hysteresis can be made substantially uninfluential by performing such adjustment immediately before the focusing that the same hysteresis curve may be always followed. To this end, maximum excitation may be employed, for example. Finally, the problem of displacement of the image plane mentioned third can be solved by introducing correcting quantities which are previously determined in the designing of the lens system for every magnification so that the objective plane remains invariable independent of magnifications. Further, it is also possible to vary the magnification in a wider range with the image plane of the ojective lens being fixed by increasing the number of the intermediate lenses.

In the light of the above, it can be estimated that variations in the focal point fall within a range from 0 to ($-$) 15 $\mu$m as a whole. Thus, it can be seen from FIG. 2 that the proper focal undershoot $\Delta f$ ranges from ($-$) 200 to ($-$) 1200 $\mu$m for the magnification of 1,000, while for the magnification of 2,000, the corresponding range is from ($-$) 50 to ($-$) 300 $\mu$m. Under the circumstance, the error on the order of 15 $\mu$m may be neglected. By way of example, when the value of excitation current $I_n$ where $I_n = I_o - \Delta I$ is previously so set that $\Delta f$ is equal to ($-$) 600 $\mu$m and ($-$) 150 $\mu$m for the magnifications of 1,000 and 2,000, respectively, the error of the focal undershoot quantity $\Delta f$ can be restricted to the ranges of ($-$) 600 to ($-$) 615 $\mu$m and ($-$) 150 to ($-$) 165 $\mu$m for both magnifications. In other words, when the excitation currents $I_n$ are previously set and stored in combination with desired magnifications in this way, it is possible to obtain optimally focussed specimen images at the selected magnifications without the need to focus the images by observing the viewing screen. As can be seen from FIG. 2, the proper focal undershoot $\Delta f$ is in the range from ($-$) 3.2 to ($-$) 19 $\mu$m for the image produced at the magnification of 8,000. Thus, by setting the current $I_n$ so that the decrement $\Delta I$ gives rise to the focal undershoot $\Delta f$ of ($-$) 4 $\mu$m, the error of the focal undershoot $\Delta f$ can be confined within the range of ($-$) 4 $\mu$m to ($-$) 19 $\mu$m, whereby the optimally focused image can be produced without fail. In this way, in the range of magnifications up to about 8,000, satisfactorily focused images can be obtained by previously settig the decrements $\Delta I$ of the excitation current in correspondence to the focal undershoots $\Delta f$, respectively, for every preselected magnifications without resorting to the visual observation of the images produced on the viewing screen, even when the specimen is exchanged or magnification is changed over.

In contrast, in the case where the specimen is to be studied with magnification of 10,000, the optimum range of the focal undershoot $\Delta f$ is from ($-$) 2 $\mu$m to ($-$) 12 $\mu$m. In this case, the error of $\Delta f$ in the range of 0 $\mu$m to ($-$) 15 $\mu$m can no more be neglected. To deal with such situation, it is proposed according to another aspect of the invention that two different excitation currents $I_n$ are preset which give rise to two different decrements $\Delta I$ resulting in two different focal undershoots $\Delta f$ of ($+$) 2 $\mu$m and ($-$) 8 $\mu$m, respectively. Then, at least one of the photographs taken at these undershoots focuses $\Delta f$, respectively, will contain a properly focused image. Further, in the case of the magnification of 18,000, the proper focal undershoot $\Delta f$ ranges from 0.7 to 4 $\mu$m. Accordingly, the excitation current $I_n$ may be so set that five decrements $\Delta I$ involving five focal undershoots $\Delta f$ of ($+$) 1, ($-$) 2, ($-$) 5, ($-$) 8 and ($-$) 11 $\mu$m, respectively, are preset. Then, five photographs taken on these conditions, respectively, will include at least one which carries the properly focussed image. In this connection, it should be mentioned that five or more photographings for one and the same specimen by changing the focal point bit by bit and subsequent selection of the one containing the most properly focussed image are procedure often employed in the art in view of the difficulty in establishing the definite proper focussing in the electron microscope.

Further, it has to be noted that magnification shown in FIG. 2 is of the photograph finally obtained and includes the magnification at which the image recorded on a photographic film is printed on a recording sheet. Since the enlarging magnification commonly employed for the photographic printing is on the order of 4 in the case of a sheet film camera and on the order of 10 in the case of a 35 mm camera. Accordingly, magnitude of the excitation current variation $\Delta I$ should be changed in correspondence with the photographic camera as used. Further, it is also possible to change magnitude of the variation $\Delta I$ in accordance with the desired enlarging magnification. Besides, in the case of magnification smaller than 8,000, it is equally possible to take a plurarity of photographs at a corresponding number of $\Delta I$, wherein the negative image which is suited for the enlarging magnification as desired can be subsequently selected. It will now be understood that sharp and clean photgraphs of specimens such as biological ones can be taken automatically without need to manually focus the specimen image by observing it, so long as the magnification is not higher than ca. 18,000, which range is most frequently employed.

As will be appreciated from the foregoing description, the parameter $I_o$ is a fixed value. This parameter $I_o$ may be determined, for example, by once carrying out the focusing at a high magnification at which the focal depth becomes significantly sharrow. On the basis of the parameter $I_o$ thus determined, the actual excitation current $I_n$ for the selected magnification can be derived by subtracting the variation $\Delta I$ corresponding to the selected magnification from the fixed value $I_o$. In this case, deformation of the specimen can be suppressed to minimum because the current $I_o$ is maintained constant, thus making unnecessary readjustment of the focus otherwise required due to possible deformation or displacement of the specimen, whereby the properly focussed image can be automatically obtained. Further, irradiation factors such as irradiated or illuminated area of the specimen, the electron beam density (image brightness) and the like can be controlled rather arbitrarily by controlling correspondingly the excitation current of the focusing lens system. Accordingly, when the proper values of the latter are preset correspondingly in conjunction with the photographing magnifications, it becomes unnecessary to manually set the above parameters upon every photographing, further facilitating the manipulation of the electron microscope system.

Figure 4:
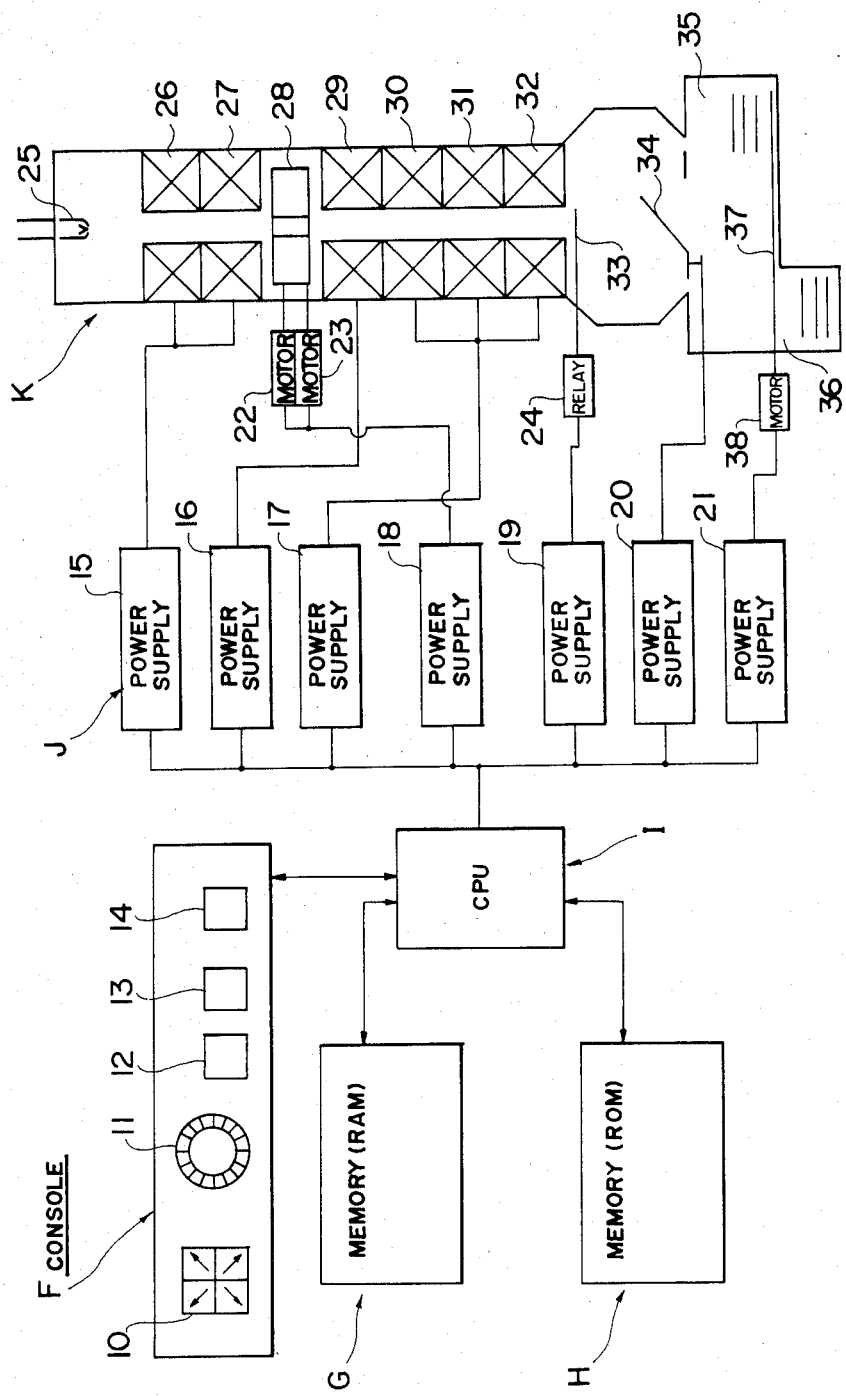
FIG. 4 shows in a schematic diagram a general arrangement of a control and manipulation system for automatic focusing and photographically recording the image of an electron microscope according to the invention.

FIG. 4 shows schematically an electron microscope system provided with an automatic photographing system in which means for automatically focusing the specimen image is combined with the shutter and the like mechanisms and which incorporates functions of storing (writing) and reading points of specimen to be observed (field of view).

Referring to FIG. 4, a reference letter F denotes a control or manipulation console on which a specimen feeding or positioning switch 10 is provided. This switch 10 comprises four changeable contacts adapted to cause the specimen to be displaced in a positive X-direction, negative X-direction, positive Y-direction and negative Y-direction, respectively, by way of associated electric motor drives. Disposed adjacent to the switch 10 is a magnification changing switch 11 by means of which the excitation current for the imaging lens system including intermediate and projecting lenses can be varied to thereby allow the desired magnification to be selected. There are further provided on the console F a storage or write switch 12, a read switch 13 and a photo switch 14 for photographing in a row with the switches 10 and 11.

The write switch 12 is to serve for storing data for observation in a memory (ROM) G. More particularly, when the switch 12 is turned on, coordinates of the specimen located on the optical axis of the microscope at that time (i.e. point of the specimen to be observed) and a desired magnification selected by the switch 12 are stored in the memory G at a predetermined address. To this end, the number of rotations of the associated drive motor may be counted starting from a reference position, wherein the count value is stored in the memory G as the value representative of the coordinate mentioned above. Further, selection of the address may be accomplished with the aid of a manually operated switch or under control of a correspodingly prepared program.

The read switch 13 is to serve for reading the data stored in the memory G. On the basis of the data thus read out, the specimen stage is displaced to reestablish the coordinate of the specimen, and at the same time the excitation current for the imaging lens system is determined with the selected magnification being set.

The photo switch 14 is to serve for causing a photographic recording apparatus to take the picture of the specimen image. When the photo switch 14 is turned on simultaneously with or in succession to the read out switch 13, an exposure meter (not shown) is activated to determine the exposure time (i.e. shutter open time), while a photographic film to be exposed is fed from a film magazine (not shown). After the exposure, the film is encased in another magazine for accommodating the exposed film.

The memory G may be constituted by a random access memory of a suitable storage capacity, wherein the X- and Y- coordinates of the specimen as well as the selected magnification or magnifications are stored at the allotted addresses. Further, correcting quantity of $\Delta T$ in consideration of the enlarging magnification as well as the number of the film frames to be exposed at the selected magnification may be additionally stored.

In addition to the memory G, there is also provided a memory H which is destined to store therein those data which include those of the excitation currents $I_n$ for the objective lens for various magnifications. For example, when the excitation current $I_n$ for the objective lens at a selected magnification M is represented by $I_{n(M)}$, the data stored in this memory H can be expressed as follows;

$$I_{n(M)} = I_o - \Delta I_{(M)}$$

where $\Delta I_{(M)}$ represents the variation in the excitation current corresponding to the focal undershoot $\Delta f$ at the said selected magnification M. Additionally, this memory H stores other various data concerning the electron beam density (brightness), the excitation currents for the condenser lens system at various magnifications, the number of frames to be exposed at particular magnifications and the like. Besides, data of excitation currents for the imaging lens system may be stored in this memory.

The data stored in the memory G and H are transferred to a central processing unit or CPU designated by a reference letter I under commands of the signals inputted through the switches 10, 11, 12, 13 and 14. The CPU in turn controls various power supply sources contained in a power supply circuit J and connected to various active elements of the electron microscope and the photographing apparatus to control them on the basis of the supplied data in accordance with a previously prepared program. The power supply circuit J includes a power source 15 connected to condenser lenses 26 and 27 of the electron microscope K for the excitation of these lenses to vary the path followed by the electron beam emitted from an electron gun 25, a power source 16 for excitation of the objective lens 29, a power source 17 for excitation of the intermediate lenses 30 and 31 and the projector lens 32, a power source 17 connected to the drive motors 22 and 23 for displacing a specimen stage 28 coupled to these motors in the X-direction and/or Y-direction in the magnetic field of the objective lens 29, a power supply 19 connected to a relay 24 for controlling the shutter 33 disposed between the projector lens 32 and a film plane 37, an exposure meter circuit 20 for determining the optimum quantity of irradiation to which the photographic film is exposed, and a power source 21 for a motor 38 for feeding frame-by-frame the photographic film from an unexposed film magazine 35 to an exposed film magazine 36 upon every photographing.

When the write switch 12 is turned on during observation of a certain point (field of view) of a specimen by using the system of the arrangement mentioned above, the relevant coordinates $X_1$ and $Y_1$ of the point or field of view as well as the magnification $M_1$ used at that time are stored in the memory G at an address $n_1$. When other fields of view are selected and the write switch 12 is actuated during observation of these fields, the corresponding coordinates $X_2, \ldots, X_n$ and $Y_2, \ldots, Y_n$ and the magnifications $M_2, \ldots, M_n$ are stored at the addresses $n_2, \ldots, n_n$ in the similar manner. The raw photographic film is contained within the film magazine 35 in a quantity at least corresponding to the number n of frames. The number of the films or frames is also previously stored in the memory G. In this connection, it is also possible to produce a signal when the number of films or frames to be exposed coincides with the number of the films or frames contained in the magazine in the course of storing the number in the memory G.

After the preparation for the photographing has been accomplished in this way, the read switch 13 and the photo switch 14 are actuated. The CPU then arithmetically reconstitutes the coordinates $X_1$ and $Y_1$ in accordance with the data stored in the memory G at the address $n_1$, while excitation currents for the objective lens 29, the intermediate lenses 30 and 31 and the projector lens 32 are established on the basis of the data read out from the memory H. Subsequently, the excitation for the condenser lenses 26 and 27 is established, which is followed by a series of operations such as the measurement of exposure, feeding of film irradiation and so forth. The photographings are successively carried out in the similar manner on the basis of the data stored at the addresses $n_2$, $n_3$, ... $n_n$. When no data is found at the succeeding address, it is determined by the CPU that the photographing process has been completed, to thereby stop the operation of the electron microscope and the photographing apparatus by breaking the power supply to the power source circuit J. In this connection, the main switch may be opened after the system has been sufficiently cooled down in succession to the turning-off of an oil diffusion pump (not shown).

When a large field of view is to be continuously observed and photographically recorded, some modification may be made on the contents of the memory with the magnification being fixed at a certain selected value, while data of the desired field of view is supplied to the CPU to arithmetically determine the displacement and the orientation of the specimen. Under the conditions, a large field of view can be automatically photographed.

As will be appreciated from the foregoing description, the focusing process of the electron microscope is automatically carried out according to the invention by virtue of such feature that the excitations for the objective lens of the electron microscope are preset selectively at one or more values in correspondence to the magnifications for the photographic recording, so that the optimal focusing can be assured at any selected magnification. This features of the automatic focusing may be combined with the automation of the shutter function, film feeding and other factors to realize a fully automated electron microscope system incorporating the photographic recording function.

I claim:

1. A method of focusing images of a specimen in an electron microscope, comprising:
   presetting excitation current for an objective lens of said electron microscope at least at a value relative to one of predetermined magnification in the manner that an under focused image of a high contrast can be obtained,
   said excitation current for the objective lens being preset taking a variation of focal point caused by various conditions in the electron microscope into consideration as follows,
      when the value of the fringe width at which the desired fringe effect can be recognized on the photograph of the specimen image can be assumed to be in a range of 50 to 120 microns, then the focal undershoot relative to the just-focal point of the objective lens is given by the following expression:

$$F = D^2 / 3.2\lambda M^2$$

where
F = focal undershoot,
D = fringe width,
λ = wave length of electron beam determined by the accelerating voltage, and
M = magnification;
when the value of the fringe width is assumed to be less than 100 microns, and then the focal undershoot is given by the following expression:

$$\Delta F = D/MA$$

where,
ΔF = focal undershoot
A = angle of the divergence of the beam which is usually constant and on the order of 1/10000 radian; and
D = fringe width;
and when the range of focal undershoot for obtaining the under focused image of a high contrast cannot cover said variation of focal point, the excitation current for the objective lens is preset at a plurality of values, whereby,
a specimen image of a high contrast can be obtained without exception at least at one value of the excitation current of the objective lens among those values under a predetermined magnification,
selecting one of said predetermined magnifications, and exciting said objective lens with the excitation current corresponding to said selected magnification.

2. A focussing method according to claim 1, wherein said excitation current for exciting said objective lens is given by following expression:

$$I_n = I_0 - \Delta I$$

where $I_n$ represents said excitation current, $I_o$ represents excitation current at which said specimen is imaged at a focal point of said objective lens, and $\Delta I$ represents a variation in said excitation current $I_o$ which causes a point at which said image is actually focussed to be displaced toward the under-focus side by a predetermined quantity (Δf).

3. A focussing method according to claim 2, wherein said quantity (Δf) is so selected that an under-fringe phenomemon makes appearance.

4. A focussing method according to claim 2, further comprising step of photographically recording the focussed image of specimen with exposure being automatically determined.

5. A focussing method according to claim 4, further including step of automatically presetting excitation current for a condenser lens system of said electron microscope so that irradiation suited for said photographic recording is accomplished.

6. A focussing method according to claim 4, wherein plural sets of first data each representative of a combination of magnification and locatio of a point on said specimen to be observed are previously stored in a first memory means, and second data representing excitation currents of said objective lens each corresponding to each of said combinations of magnifications and locations are previously stored in a second memory means together with data required for the photographic recording, and wherein upon selection of magnification, said first and second data corresponding to said selected magnification are read out from said first and second memory means an arithmetically processed, whereby said specimen is automatically positioned so that said point is centered, said objective lens being excited with the excitation current corresponding to said selected magnification, and the corresponding photographic recording conditions being automatically established through respective control means on the basis of the results of said arithmetic processing.

7. A focussing method according to claim 4, further including steps of focusing the image of at least a single point on said specimen to derive a value of said excitation current at which said image is focussed in a satisfactory manner, presetting variations of said excitation current for said objective lens in correspondence with said preset magnifications with reference to said derived value, and applying the variation corresponding to the selected magnification to said excitation current upon photographing the image focussed through said objective lens.

8. An electron microscope, comprising automatic photographing means for allowing film feeding, operation of shutter, determination of exposure to be effected in an automated manner, a specimen stage adapted to be displaced by motor drive means, memory means operatively coupled to magnification changing means of said microscope for storing data representative of excitation current for an objective lens of said microscope predetermined in correspondence with the magnification at which a specimen is to be photographed, and means for controlling the excitation current applied to said objective lens in accordance with the data read out from said memory means upon photographing with the corresponding magnification, the data stored in said memory means representing a plurality of values of the excitation current for the objective lens in correspondence with at least one magnification at which variation of focal point caused by various conditions in the electron microscope cannot be covered by the range of focal undershoot for obtaining the under focused image of a high contrast said variations in focal point being taken into consideration as follows, when the value of the fringe width at which the desired fringe effect can be recognized on the photograph of the specimen image can be assumed to be in a range of 50 to 120 microns, then the focal undershoot relative to the just-focal point of the objective lens is given by the following expression:

$$\Delta F = D^2 / 3.2 \lambda M^2$$

where
$\Delta F$ = focal undershoot,
D = fringe width,
$\lambda$ = wave length of electron beam determined by the accelerating voltage, and
M = magnification
when the value of the fringe width is assumed to be less than 100 microns, and then the focal undershoot is given by the followings expression:

$$\Delta F = D / MA$$

where
$\Delta F$ = focal undershoot
A = angle of the divergence of the beam which is usually constant and on the order of 1/10000 radian; and
D = fringe width;
said automatic photographing means effecting a shuttering operation a number of times controlled in accordance with the data read out from said memory means upon photographing with said at least on magnification.

* * * * *